United States Patent [19]

Kuo et al.

[11] Patent Number: 5,789,263
[45] Date of Patent: Aug. 4, 1998

[54] AMORPHOUS SILICON COLOR DETECTOR AND MANUFACTURE OF SAME

[75] Inventors: Lee-Ching Kuo, Hsinchu; Ming-Hann Tzeng, Miaoli; Yean-Kuen Fang, Tainan, all of Taiwan

[73] Assignee: Industrial Technology Research Institute, Taipei, Taiwan

[21] Appl. No.: 475,191

[22] Filed: Jun. 7, 1995

Related U.S. Application Data

[62] Division of Ser. No. 861,294, Mar. 31, 1992, Pat. No. 5,449,923.

[51] Int. Cl.$^6$ .................................................... H01L 27/14
[52] U.S. Cl. ................................ 437/3; 437/4; 437/101
[58] Field of Search .......................... 437/2, 3, 4, 10.1, 437/18.1, 51; 257/52, 59, 54, 53, 440; 136/249, 255; 250/226, 370.08, 370.14, 214.1

[56] References Cited

U.S. PATENT DOCUMENTS

| | | | |
|---|---|---|---|
| 4,671,853 | 6/1987 | Takayama | 437/3 |
| 4,680,085 | 7/1987 | Vijan et al. | 156/643 |
| 4,811,069 | 3/1989 | Kakinuma et al. | 257/54 |
| 4,820,915 | 4/1989 | Hamakawa et al. | 257/440 |
| 5,010,018 | 4/1991 | Polasko et al. | 437/3 |
| 5,053,844 | 10/1991 | Murakamp et al. | 257/55 |
| 5,140,397 | 8/1992 | Haga et al. | 257/53 |
| 5,155,565 | 10/1992 | Wenz et al. | 136/244 |
| 5,270,530 | 12/1993 | Malhotra | 257/53 |
| 5,291,036 | 3/1994 | Tran et al. | 257/53 |
| 5,311,047 | 5/1994 | Chang | 257/53 |

FOREIGN PATENT DOCUMENTS

| | | | |
|---|---|---|---|
| 60-210884 | 10/1985 | Japan | 257/54 |
| 63-155760 | 6/1988 | Japan | 257/54 |
| 4-42976 | 2/1992 | Japan | 257/53 |

OTHER PUBLICATIONS

Tsai et al., "An Amorphous SiC/Si Two-Color Detector", *IEEE Electron Device Letters*, vol. EDL-8, No. 8 (1987).

Wu et al., "Amorphous Silicon Phototransistor on a Glass Substrate", *IEEE Transactions on Electron Devices*, vol. ED-32, No. 11 (1985).

Tsai et al., "Amorphous SiC/Si Three-Color Dectector", *Appln. Phys. Lett.*, vol. 52, No. 4, pp. 275-277 (1988).

Yang et al., "Four-Color Discriminating Sensor Using Amorphous Silicon Drift-Type Photodiode", *Sensors and Actuators*, vol. 14, pp. 69-77 (1988).

*Primary Examiner*—John Niebling
*Assistant Examiner*—S. Mulpuri
*Attorney, Agent, or Firm*—Scully, Scott, Murphy & Presser

[57] ABSTRACT

An amorphous silicon color detector comprising a structure composed of a transparent conductive oxide film (TCO) layer/an a-Si:H layer/a metal layer, of which the a-Si:H layer is an amorphous silicone layer having a thickness greater than 1 μm, and the metal layer is made of a metals selected from the metal group consisting of Cr, Au, Pd, Al, Pt, Mo, Ag or Ti. A depletion region of the color detector is re-arranged in position and in content thereof according to the absorbencies to different color lights in different bias voltages to achieve the purpose of detecting different color light. An amorphous silicone color image sensor comprises a plurality of the color detectors arranged in linear array incorporated with a scanning device, a processor and an A/D converter to process the signals obtained from scanning. The amorphous silicone color image sensor is especially used in a scanning machine or a fax machine. A manufacture process of the amorphous silicon color detector is also disclosed.

3 Claims, 8 Drawing Sheets

AMORPHOUS SILICON COLOR DETECTOR AND MANUFACTURE OF SAME

This is a divisional of application Ser. No. 07/861,294, filed on Mar. 31, 1992 U.S. Pat. No. 5,449,923.

BACKGROUND OF THE PRESENT INVENTION

The present invention relates to an amorphous silicon color detector made from amorphous materials which by being applied with different bias voltages, will have different absorbencies for the three primary colors of red, green and blue, whereby the colors can be detected.

The present invention also relates to an amorphous silicon color image sensor which utilizes a plurality of the color detectors arranged in a linear array for sensing colors and images of documents, a scanning device for reading the output of the array of detectors, an A/D converter for converting the output to digital signals and a processor for processing the signals to output. The sensor can be used in a fax machine or a scanning machine.

The present invention further relates to a manufacturing method of the amorphous silicone color detector.

Presently known commercialized color detectors are mainly made of two types of materials, i.e., single crystal silicon and amorphous silicon. Single crystal silicon color detectors comprise two types of detectors, one comprises a photo-diode and a filter, and the other omits the filter, but is structured as a PNP type. The amorphous silicon detectors can provide the advantages of easy manufacturing process, reduced cost (because of low temperature process and because that the amorphous silicon can be deposited on large-sized substrates, an enlarged device can be made) and the amorphous material thereof can be grown on different substrates (such as glass, metal, ceramic and polymeric film). Therefore, the amorphous silicon is now more widely used in semiconductor devices. In particular, as the response spectrum of amorphous silicon is very close to that of the visible light and the amorphous silicon has a high sensitivity to light (i.e., the ratio of light/dark conductivity thereof is high) and a short response time of light, the amorphous silicon is deemed to be a good material for use as a light detecting material. Besides, the amorphous silicon has a very high absorption coefficient to light ($\geq 10^4$ cm$^{-1}$) in the visible light range. Please refer to FIG. 7, wherein curve A is a sensitivity curve of human eyes to light and curves B and C are the spectral response curves of amorphous silicon and single crystal silicon photodiodes to visible light, respectively. As can be seen in the figure, amorphous silicon has the maximal changes in relative sensitivity to light of wavelengths in the range between 400–700 nm. It means that the amorphous silicon has particularly high absorbance to light in a certain wavelength range, and hence is particularly advantageous for use as color sensing elements.

Amorphous silicon color detectors have been used in image sensors, solar cells, xerography machine and color sensors. Amorphous silicon color detectors are used to convert the light absorbed by the photodiodes or photoconductors into electrical signals for output.

At present, the most widely used amorphous silicon color detector has a filter plate on an amorphous silicon photodiode. As shown in FIGS. 8(a)–8(c), such color detectors mainly comprise three kinds of detectors, i.e., a visible light detector (see FIG. 8(a)), a single color detector (see FIG. 8(b)) and an integrated full-color detectors (see FIG. 8(c)). All these detectors comprise glass substrates 81, transparent electrodes 82, amorphous silicone 83, inner electrodes 84, lead frames 85 and resin housings 86. In order to achieve the object of a single color detection, the glass substrate 81 can be covered with a color filter plate 87 (as seen in FIG. 8(b)), or a filter plate 88 including the three colors of red, green and blue to reach a full-color detecting object (as shown in FIG. 8(c)). However, the above-mentioned detectors have a common problem, i. e., an additional filter plate is required, the structures thereof become more complicated and the cost thereof increases. To solve the above problems, an amorphous silicon photo-detector has been developed which needs no additional filter plate. Such detectors use a particular diode structure and according to absorbencies for different colors, are applied with different bias voltages thereto to distinguish the color.

The other type of amorphous silicon color detector omits the filter plate. The color detectors made by the method mainly comprise an a-Si:H (amorphous silicon) photo transistor and a-Si:H/a-SiC:H hetero junction and have a n$^+$-i-p$^+$-i-n$^+$ structure, such as those proposed by Hsiung-kuang Tsai et al in a paper titled "An Amorphous SiC/Si Two/color Detector", IEEE Electron Devices Letters, Vol. EDL-8, No. 8; and by B. S. Wu et al in a paper titled "Amorphous Silicone Photo-transistor on a Glass Substrate", IEEE Transactions on Electron Devices, Vol. ED-32, No. 11, November 1985. The Chinese Patent No. 105721 filed by Si-Chen Lee, et al titled "Amorphous SiC/Si three-color detector" suggests a structure of the transistor-type as described above with an additional i layer added to the original i layers to form a structure of n$^+$-i-i-p$^+$-i-i-n$^+$ which is as shown in FIG. 9. By being applied with bias voltages within the range of ±2V, the detectors can distinguish three color lights of red, blue and green according to the absorbance of the junction to the lights. The spectral responses for the three lights are shown in FIG. 10. FIG. 10 shows the measured response under voltage bias of –2.0 V, –0.2 V and 2.0 V, respectively. When $V_{CE}$=+1 V, the response to light having wavelength of 480 nm (blue light) is maximal, then blue light is detected; when $V_{CE}$=–0.2 V, the response to light having wavelength of 500 to 600 nm is maximal, then green light is detected; and when $V_{CE}$=–2 V, red light is detected.

However, the above transistor-type structure has the following disadvantages: (1) the structure is too complicated and the thickness of the p layer has to be controlled to about 100 Å, which is difficult to do during the manufacturing process; (2) the p layer has a high doping density which would most likely contaminate the adjacent i layer and would cause the i layer to become a p$^-$ layer and make the response to the spectrum poor; and (3) the structure disclosed in Chinese Patent No. 105721 is particularly complicated since it adds a second i layer to the first i layer, resulting in the structure of indium tin oxide (ITO) /n-i-i-p-i-i-n/metal. Different donors and energy gap densities are needed between the two i layers and during the manufacturing process. The conditions of the manufacturing process are controlled only by means of the flow ratio of the SiH$_4$/H$_2$. Under such conditions, it is extremely difficult to grow i layers with different donor and obtain necessary energy gap density. The process parameters are dependent on the structure of the reaction chamber and the peripheral design of the reaction system. Therefore, it is difficult to control the process parameters to grow i layers with different donors and energy densities. Also, the specification of the Chinese Patent No. 105721 lacks the description concerning the manufacturing process of the i layers, no mention about what the relationship between the size of the energy gap and the conditions when the film is grown up. Obviously, it is not easy to control in manufacture.

SUMMARY OF THE INVENTION

One object of the present invention is to provide a color detector made from amorphous silicon without requiring additional filter plate. The color detector has a structure composed of an amorphous silicon back-to-back Schottky diodes which by being applied with different bias voltages thereto can detect different colors. The structure of the invention is not as complex as that of the above-mentioned prior art and the manufacturing processes are simple, thus providing a color detector which is low in cost, easy to manufacture, and has an extremely fast response to light.

Another object of the present invention is to provide a compact color image sensor which comprises a plurality of color detecting elements arranged in a linear array. The image sensor can scan a color document and detect images and colors of the color document by means of being applied with different bias voltages, and sending signals obtained after scanning to a central processing unit (CPU) for processing.

A further object of the present invention is to provide a method of manufacturing an amorphous silicone color image detector whereby providing an color image detector with a simple structure at low cost.

These and other objects and advantages of the present invention will be described in detail by way of the preferred embodiments in connection with the accompanying drawings.

DESCRIPTION OF THE PREFERRED EMBODIMENT

Figure 1:
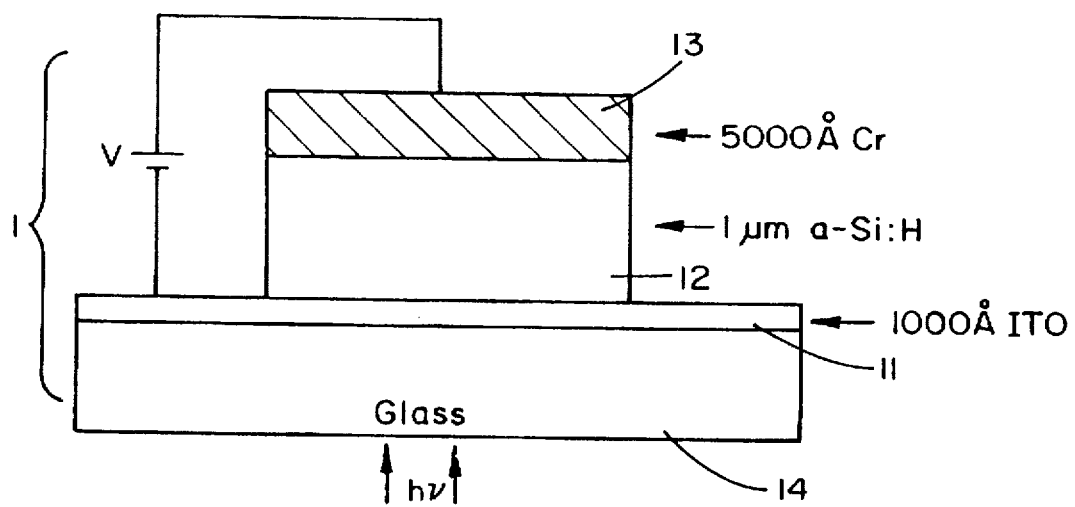
FIG. 1 shows the structure of an embodiment of a vertical-type amorphous silicon back-to-back Schottky diode three-color detector of the present invention.

FIG. 1 shows a three-color detector of the present invention which mainly comprises a vertical-type amorphous silicon back-to-back Schottky diode 1. The vertical-type amorphous silicon Schottky diode 1 comprises a transparent conductive oxide thin film layer 11 (e.g. a TCO (Indium Tin Oxide) layer in the figure), an a-SiH layer 12, a metal layer 13 and a glass 14. The diode should have a total thickness $\geq 0.9$ µm and the material of the metal layer 13 is a metal selected from the group consisting of Cr, Au, Pd, Al, Pt, Mo, Ag or Ti. Additionally, the transparent conductive oxide thin film 11 can be indium tin oxide thin film (ITO), a SnO thin film or a ZnO thin film. In the figure, it can be seen that the diode of the present invention only includes one intrinsic layer of amorphous silicon. The light source is emitted to the diode 1 from the TCO layer 11 (in the direction of the arrow hγ in FIG. 1) and the diode 1 is applied with different bias voltages to obtain the function of detecting colors.

The manufacturing method of the vertical-type amorphous silicon back-to-back Schottky diode 1 in accordance with the present invention comprising the following steps:

(1) Growing the TCO thin film 11 on the glass 14 with E-beam gun evaporator, sputteror, thermal evaporator; the thickness of the TCO film is about 1000 Å;

(2) Depositing the a-Si:H layer 12 about 1 µm on the TCO thin film 11 by a GD-CVD (glow-discharge chemical vapor disposition) method at a temperature about 250° C., pressure 0.5 Torr and RF (radio frequency) power density of 0.08–0.14 W/cm$^2$; and (3) Depositing a metal layer about 5000 Å (Cr, Au or Pd) on the a-Si:H layer 12 in a E-beam gun evaporator system.

Figure 2:
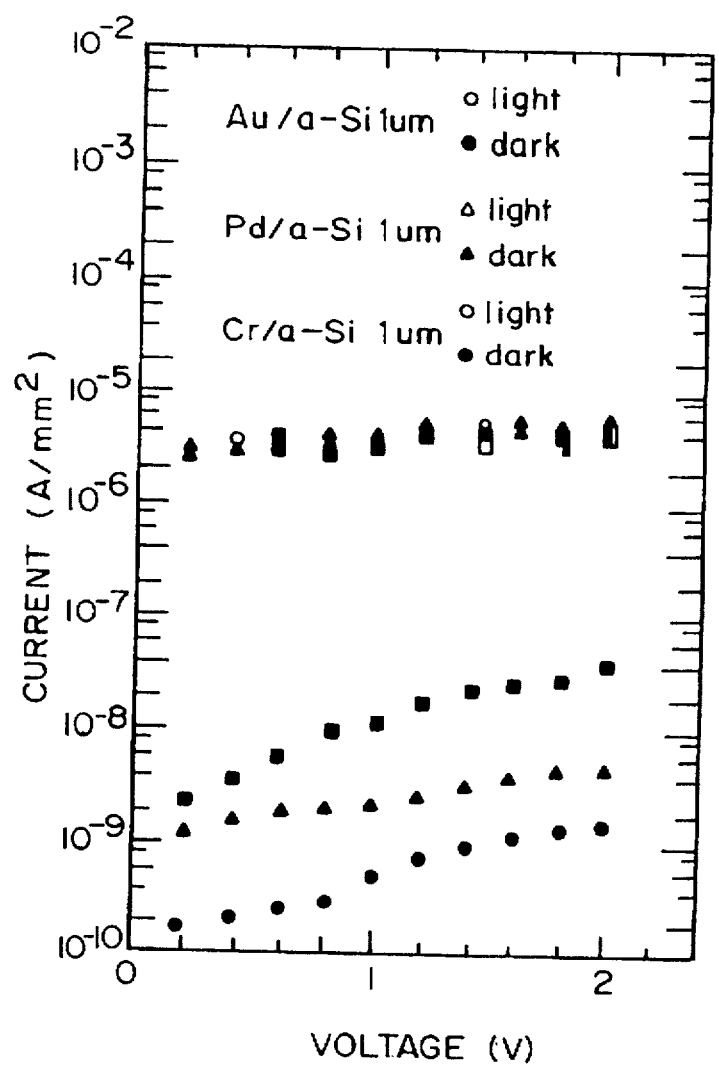
FIG. 2 shows dotted curves of reverse bias voltage vs light/dark current obtained from the Schottky diode structure of the present invention which are made of Au/a-Si (1 µm), Pd/a-Si (1 µm) and Cr/a-Si (1 µm)

The present invention utilizes a Schottky diode as a detecting element. The metal layer 13 can be made from Cr, Pd or Au. The dotted I-V curves for diodes respectively made from the three metals is as shown in FIG. 2. It can be seen from the figure that each of the dark and photo current ratios of the metals is suitable for use in the detector of the present invention. The dark current of Au is the lowest and is most optimal for use. However, both Au and Pd are too expensive compared with Cr. Since Cr is low in cost and its dark current value meet the requirements for the detector of the present invention, Cr is most often used in the detector. The thickness of the a-Si:H layer being more than 1 µm will be helpful for better performance.

Figure 3A:
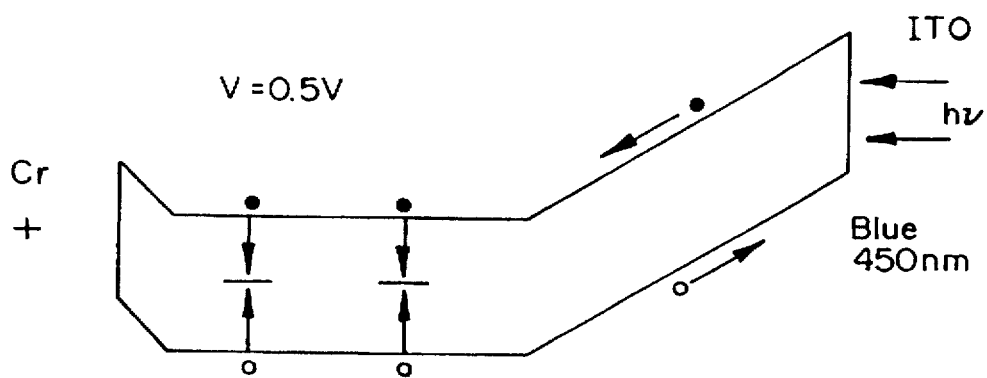
FIGS. 3(a), 3(b) and 3(c) show the energy bands obtained by applying bias voltages of 0.5 V, 1.5 V and −1.5 V, respectively, to the three-color detectors of FIG. 1.
Figure 3B:
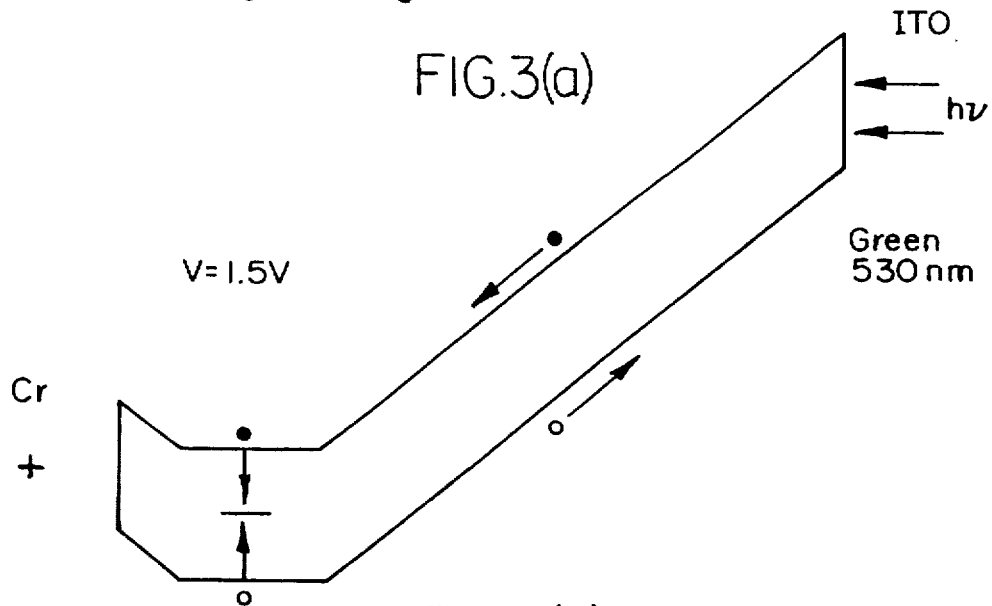
Figure 3C:
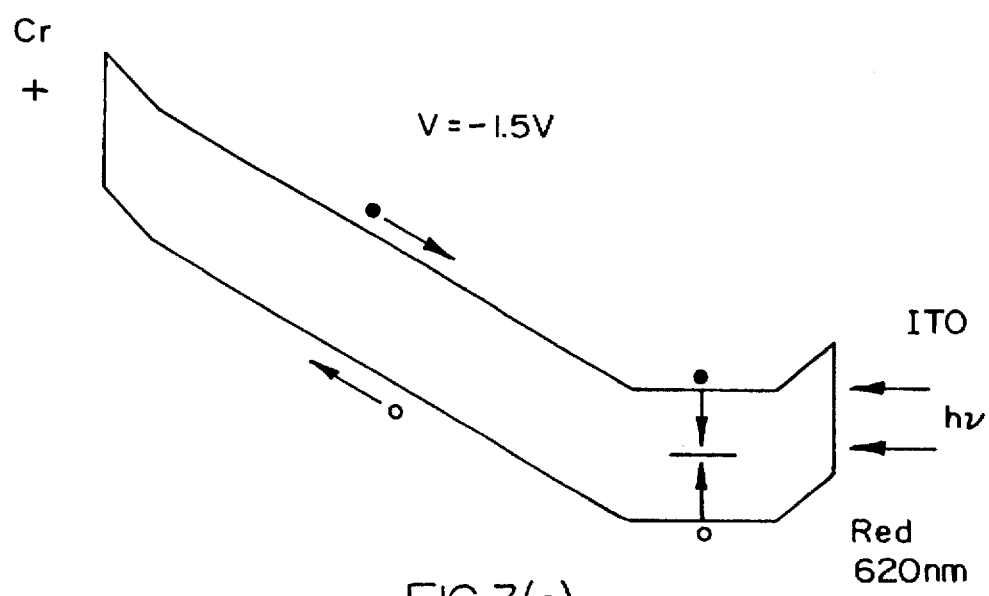

FIGS. 3(a)–3(c) illustrate the basic energy bands of the diode of the present invention shown in FIG. 1 at (a) V>0, (b) V=0 and (c) V<0. There are two back-to-back Schottky junctions with different absorption spectra in FIG. 1. The first junction is a Cr/a-Si:H junction and the second junction is an ITO/a-Si:H junction. If the applied voltage V>0, the ITO/a-Si:H Schottky junction is reverse biased. When the light is incident from the glass substrate, the photoresponse is dominated by carrier collection in this junction. Based on the above discussion, more than 98% of the incident blue light (wavelength thereof is about 350–500 nm) is absorbed within 1400 Å from the surface (ITO 11 in this case) which is closest to the emitted light. Hence, a shallow photon collection region is enough. The green and red lights can penetrate a deeper region; thus, in sensing these lights, a large bias is needed to extend the photon collection region. The green light (wavelength thereof is about 500 nm–580 nm) is absorbed deeper than 1400 Å from the surface (ITO layer 11). In particular, for absorption of red light, still larger bias or reverse bias (V<0) shall be applied to induce the deepest photon collection region for photo-excited carrier collection. However, in the back-to-back Schottky diode, the large bias is not appropriate since it may result in a breakdown situation. When V<0, the Cr/a-Si:H Schottky junction is reverse biased and the major photoresponse is determined by this junction. This reversed junction prefers to absorb red light, because only the red light can reach so deep a depth. The absorption region of red light is at the depth of 4000 Å of the diode from the surface (the ITO layer 11). Therefore, by changing the position and range of a depletion region (not shown) of the photo diode, the diode is allowed to effect different absorptions for light rays of different colors.

In accordance with the present invention, the three-color image detector has three absorbencies to emitted light under the bias voltages 0.5 V, 1.5 V and −1.5 V. FIG. 3(a) shows that when the TCO layer 11 is connected to a negative terminal and the metal layer 13 to a positive terminal of a voltage source (not shown) and a bias voltage 0.5 V is applied to the detector, the depletion region will be close to the TCO layer 11 and at the time, the detector absorbs most of the blue light of the emitted light. FIG. 3(b) shows that when applying the bias voltage (e. g. 1.5 V), the depletion region will be extended further inside the diode and most of red light of the emitted light is absorbed at the time. Further, when the TCO layer 11 is connected to the positive terminal and the metal layer 13 is connected to the negative terminal of the voltage source, the depletion region will be closer to the metal layer 13 and red light of the emitted light is absorbed, as shown in FIG. 3(c).

Figure 4:
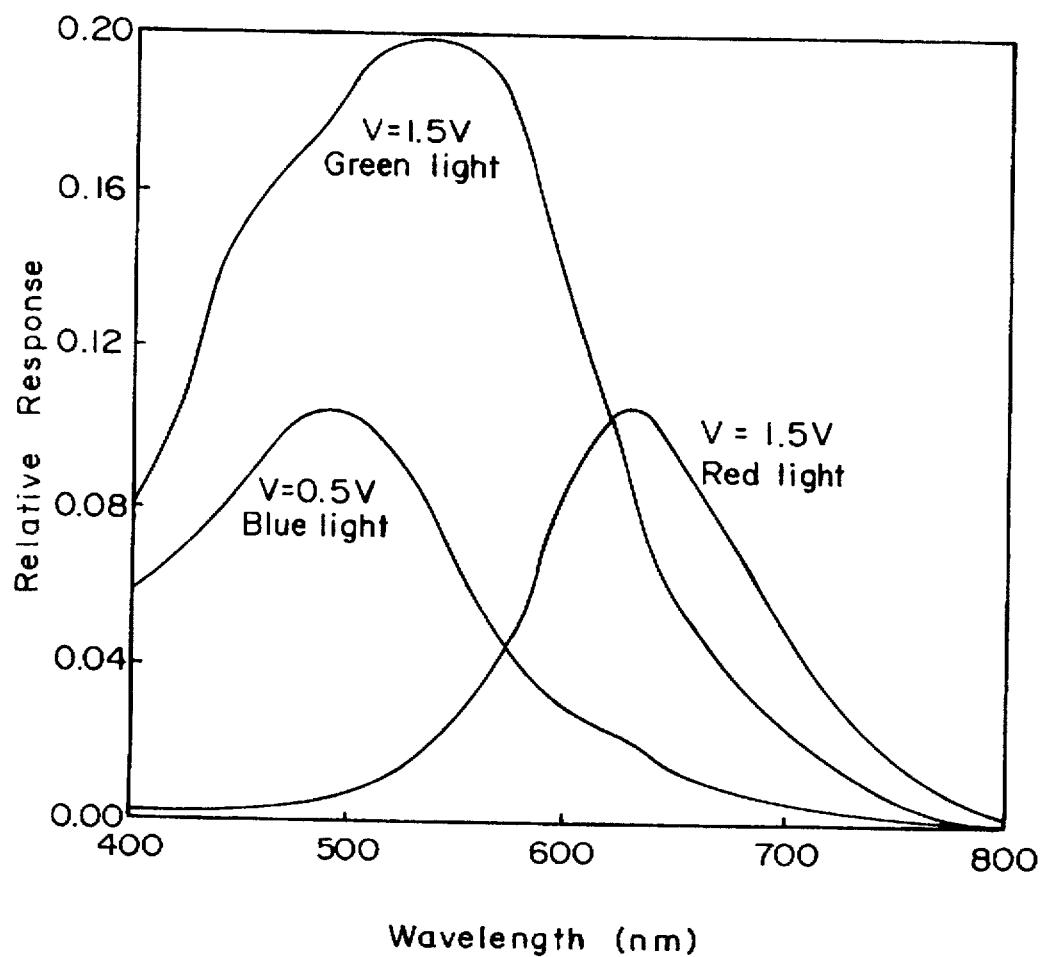
FIG. 4 shows a spectral response of the vertical type amorphous silicon back-to-back Schottky diode of the present invention under the bias voltages of 0.5 V, 1.5 V and −1.5 V.
Figure 5A:
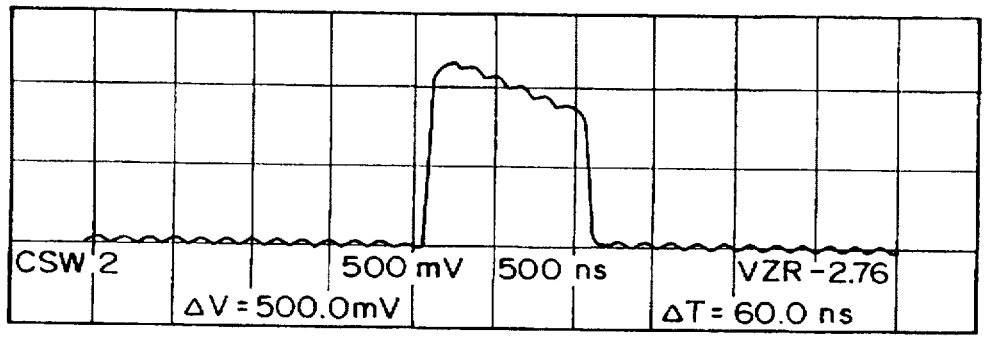
FIGS. 5(a), 5(b) and 5(c) show the photo-response waveforms under incident red LED light, the bias voltage being 0.5 V in FIG. 5(a), 1.5 V in FIG. 5(b) and −1.5 V in FIG. 5(c), wherein ΔV represents the voltage difference between 10% to 90% of the photo-response waveform, and ΔT represents the rise time defined as the time needed to rise the waveform from 10% to 90%.
Figure 5B:
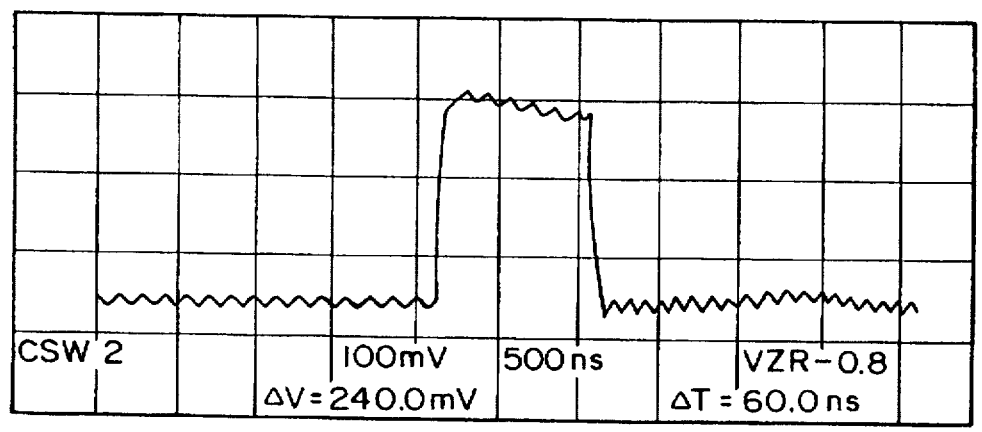
Figure 5C:
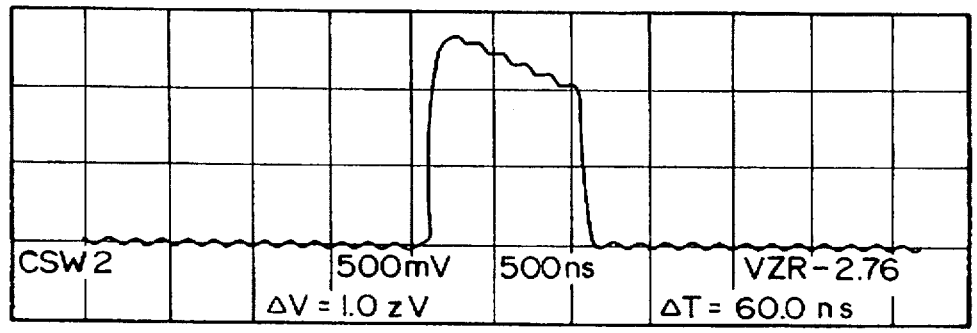

FIG. 4 shows the test results of the spectral responses at bias voltages of 0.5 V, 1.5 V and −1.5 V for the color detector having the TCO/a-Si:H/Cr structure manufactured by the above-mentioned method. From the figure, it can be seen that at V=0.5 V, the detector mainly detect the blue photons with a peak response at $\lambda$=480 nm; at V=0.5 V, the peak response shifts to $\lambda$=540 nm, which means that the detector mainly detect the green photons at this time; and at V=−1.5 V, the detector mainly detect the red light and the peak response is at $\lambda$=628 nm. The three response curves can be clearly distinguishable for determining the detected color. In addition, FIGS. 5(a)–5(c) respectively shows the photocurrent response measured by using an electronic switching system and red LED of 150 lux as light source. The area of the diode was 100 μm×100 μm. The applied bias voltage in FIG. 5(a) is 1.5 V, in FIG. 5(b) is 0.5 V and in FIG. 5(c) is −1.5 V. Since a same light source was used, the measured rise time is also same for all bias, i.e., 60 ns. However, the voltage change V for each bias is different, i. e., 900 mV (in 1.5 V as shown in FIG. 5(a)), 240 mV (in 0.5 V as shown in FIG. 5(b)), and 1020 mV (in −1.5 V as shown in FIG. 5(c)), respectively. Such results can also be used as a supplementary evidence for the selection of color of the diode.

Figure 6:
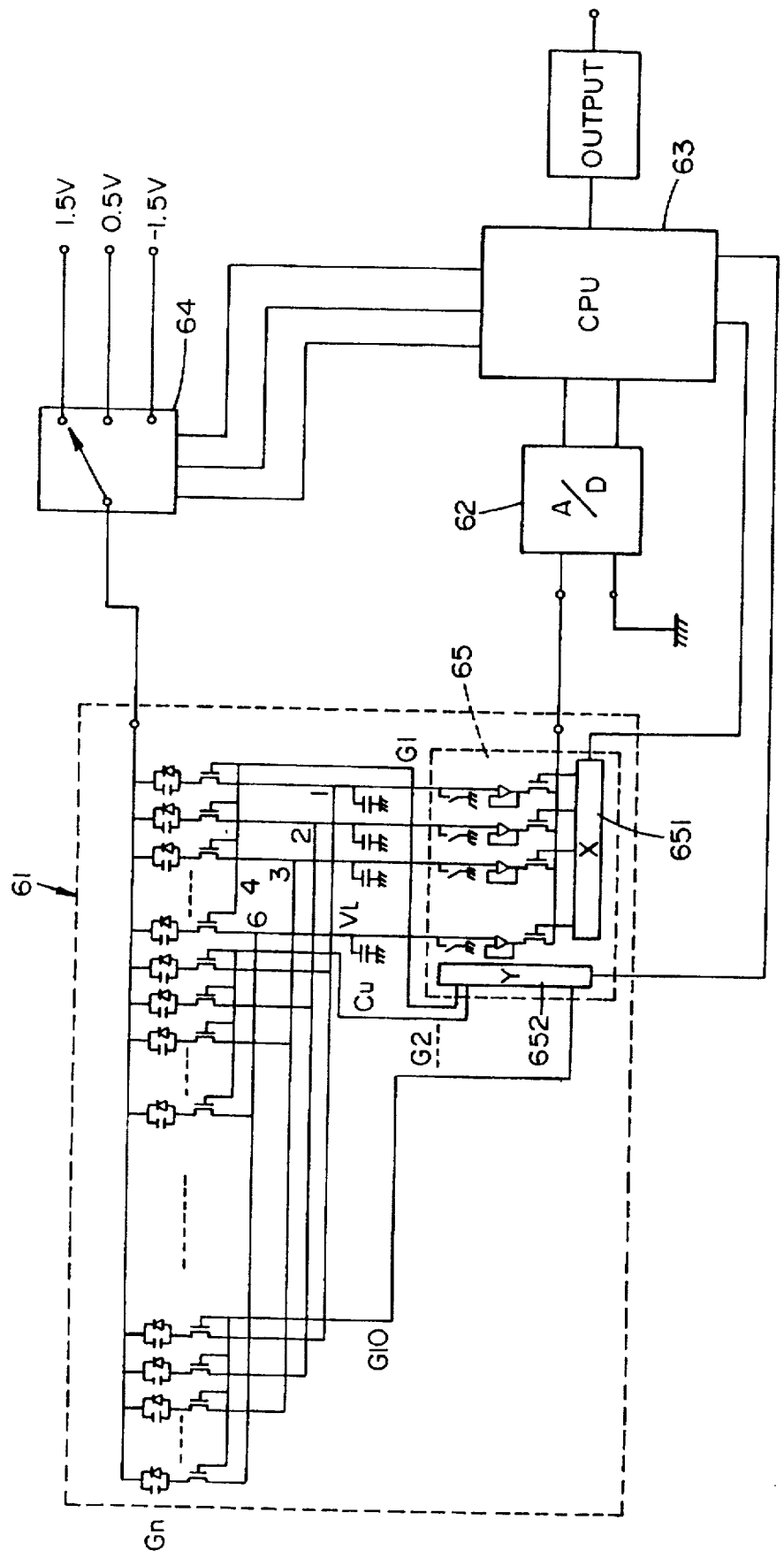
FIG. 6 is a circuit diagram of an amorphous silicon color image sensor which comprises a plurality of three-color detectors in a linear array of FIG. 1.
Figure 7:
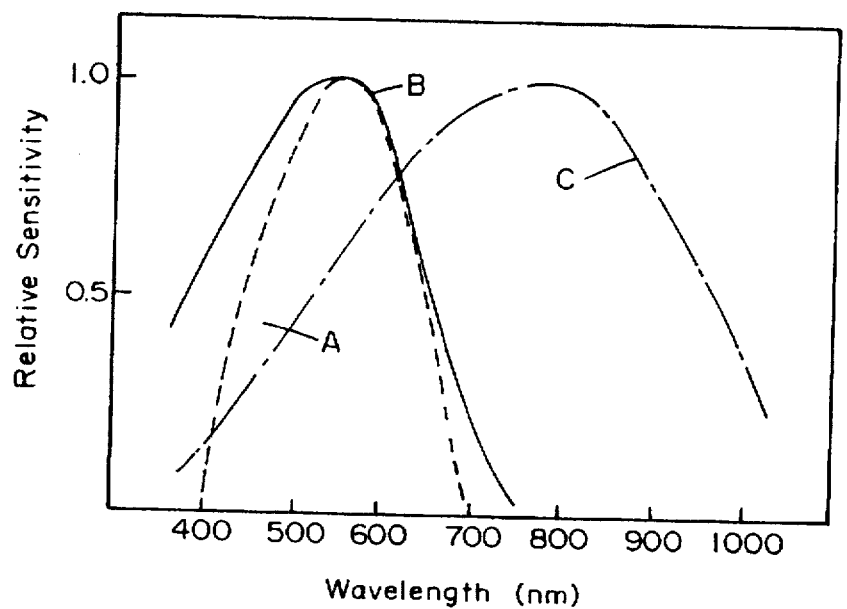
FIG. 7 shows the relative sensitivity of spectral response of typical amorphous silicon and single crystal silicon photo detectors.
Figure 8A:
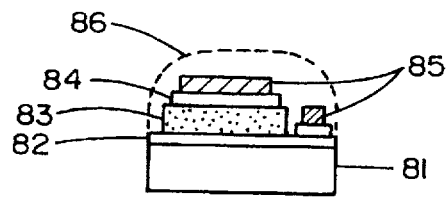
FIGS. 8(a), 8(b) and 8(c) show the structural diagrams of a visible light detector, a single color detector, and an integrated full-color detector, respectively.
Figure 8B:
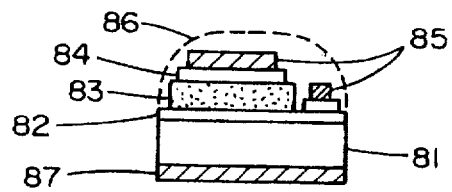
Figure 8C:
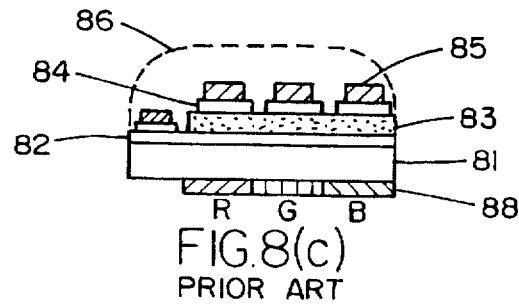
Figure 9:
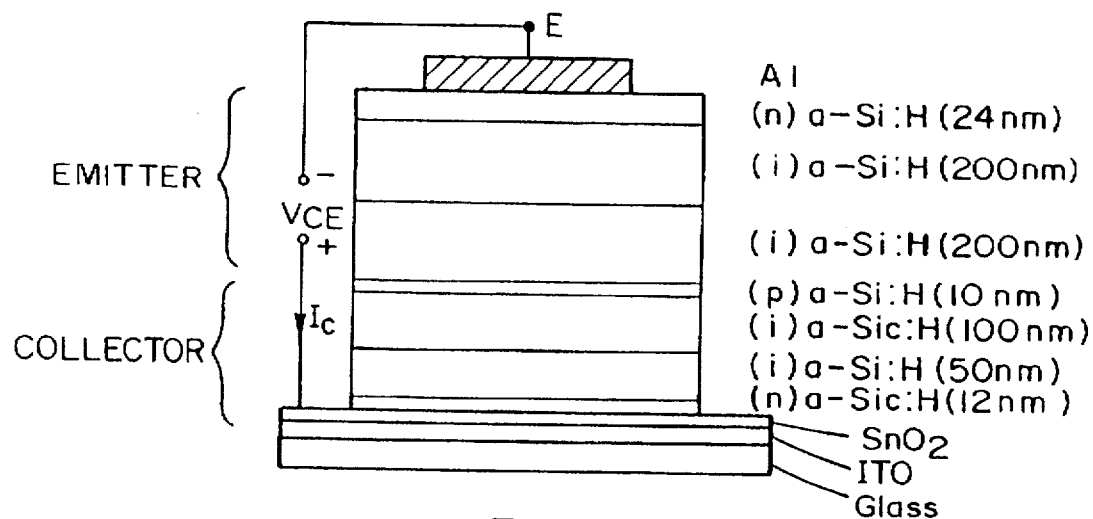
FIG. 9 shows the structural diagram of a conventional SiC/Si amorphous silicon three-color detector.
Figure 10:
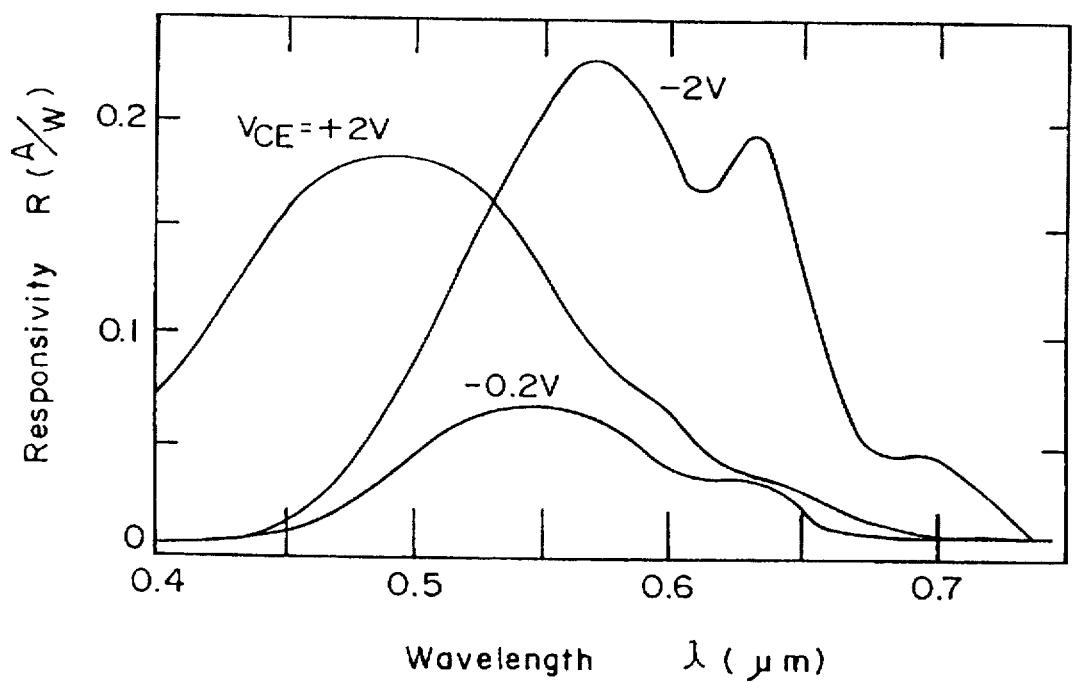
FIG. 10 shows the spectral response diagram of the detector of FIG. 9.

Another embodiment of the present invention is as shown in FIG. 6 which is an amorphous silicon color image sensor. The image sensor comprises a plurality of the amorphous silicon color detectors arranged in a linear array 61, an A/D converter 62, a CPU 63 and an analogue switch 64. The array of detectors further connects a scanner 65 which scans the detectors with a X shift register 651 and a Y shift register 652. The analogue switch 64 can provide a 1.5 V, a 0.5 V and a −1.5 V bias voltages to the array of detectors 61. In the embodiment, the bias voltage for detecting green color is 1.5 V, that for detecting blue color is 0.5 V and that for detecting red color is −1.5 V. The detectors 61 are as shown in FIG. 1 of the present invention. As mentioned above, by applying a common bias to each of the detectors, the detectors will detect the color of the incident light according to the absorbance of the light and output corresponding voltage values. In the image sensor, when used for detecting the colors of a detected document, the switch 64 is in turn switched to provide a 1.5 V, 0.5 V or −1.5 V bias voltage to the array of detectors 61 which responding to the input bias voltage output corresponding voltage values. The scanner 65 scans the outputs of the array of the detectors 61, then the A/D converter 62 converts the scanned values into digital signals and send the converted digital signals to the CPU 63 for magnification calibration into output after digital processing by the CPU. The image sensor of the present invention is particularly suitable for use in color fax machines or scanners.

From the foregoing, it can be seen that the color detector of the present invention is simple in structure, easy to manufacture and low in cost, wherein the amorphous silicon layer comprises only an undoped layer and therefore, quality can be easily controlled. In addition, the detector can be utilized in a compact color image sensor and thus can be used to scan and sense the intensities of the colors and the image of a document, thus allowing for use on fax machines and scanners at a cost lower than currently known color image sensors. The present invention can also be modified into various embodiments by those skilled in the art without departing from the spirit of the present invention and are within the scope thereof.

I claim:

1. A method for manufacturing an amorphous silicon color detector comprising:

(1) growing a transparent conductive oxide thin film on glass, the thickness of said oxide thin film is about 1000 Å;

(2) depositing an undoped amorphous silicon layer of about 1 μm on said oxide thin film by a glow-discharge chemical vapor deposition method at a temperature about 250° C., a pressure of 0.5 Torr and a radio frequency power density of 0.08–0.14 W/cm$^2$; and (3) depositing a metal layer about 5000 Å on said undoped silicon layer in a E-beam gun evaporator system to provide an amorphous silicon color detector that is capable, upon application thereto of bias voltage within the range of ±1.5 V, of identifying red, blue and green lights.

2. The method as set forth in claim 1, wherein the transparent conductive oxide thin film is an indium tin oxide film, a SnO$_2$ film or a ZnO film.

3. The method as set forth in claim 1, wherein the metal layer is formed from a metal selected from the group consisting of Cr, Au, Pd, Al, Pt, Ti, Mo and Ag.

* * * * *